(12) United States Patent
Hsu et al.

(10) Patent No.: US 7,409,019 B2
(45) Date of Patent: Aug. 5, 2008

(54) HIGH SPEED MULTI-MODE RECEIVER WITH ADAPTIVE RECEIVER EQUALIZATION AND CONTROLLABLE TRANSMITTER PRE-DISTORTION

(75) Inventors: Louis C. Hsu, Fishkill, NY (US); Brian L. Ji, Fishkill, NY (US); James S. Mason, Eastleigh (GB); Karl D. Selander, Hopewell Junction, NY (US); Michael A. Sorna, Hopewell Junction, NY (US); Steven J. Zier, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 735 days.

(21) Appl. No.: 10/711,713

(22) Filed: Sep. 30, 2004

(65) Prior Publication Data

US 2006/0067440 A1 Mar. 30, 2006

(51) Int. Cl.
*H04L 27/08* (2006.01)
(52) U.S. Cl. .................. 375/345; 375/229; 375/232; 375/233
(58) Field of Classification Search .......... 375/345, 375/229, 232, 233
See application file for complete search history.

(56) References Cited

U.S. PATENT DOCUMENTS

| | | | |
|---|---|---|---|
| 5,068,873 A | 11/1991 | Murakami | |
| 5,881,108 A * | 3/1999 | Herzberg et al. | 375/296 |
| 6,243,425 B1 * | 6/2001 | Langberg et al. | 375/285 |
| 6,798,828 B1 * | 9/2004 | Phanse | 375/219 |
| 2002/0044598 A1 * | 4/2002 | Frenkel et al. | 375/232 |
| 2002/0094055 A1 | 7/2002 | Cranford, Jr. et al. | |
| 2002/0095541 A1 | 7/2002 | Cranford, Jr. et al. | |
| 2002/0136343 A1 | 9/2002 | Cranford, Jr. et al. | |
| 2003/0035495 A1 * | 2/2003 | Laamanen et al. | 375/296 |
| 2004/0114670 A1 | 6/2004 | Cranford, Jr. et al. | |
| 2004/0170244 A1 | 9/2004 | Cranford, Jr. et al. | |
| 2007/0147559 A1 * | 6/2007 | Lapointe | 375/350 |

OTHER PUBLICATIONS

U.S. Appl. No. 10/249,545, filed Apr. 17, 2003.
U.S. Appl. No. 10/250,043, filed May 30, 2003.
U.S. Appl. No. 10/250,177, filed Jun. 10, 2003.
U.S. Appl. No. 10/710,064, filed Jun. 16, 2004.
U.S. Appl. No. 10/604,799, filed Aug. 18, 2003.
Fuji Yang et al., "CMOS Low-Power Multiple 2.5-3.125-Gb/s Serial Link Macrocell for High IO Bandwidth Network ICs", *IEEE Journal Of Solid-State Circuits*, vol. 37, No. 12, Dec. 2002, pp. 1813-1821.
John Teifel et. al. "A High-Speed Clockless Serial Link Transceiver", *Proceedings of the 9th International Symposium on Asynchronous Circuits and Systems*, 2003.

(Continued)

*Primary Examiner*—Mohammad Ghayour
*Assistant Examiner*—Juan A. Torres
(74) *Attorney, Agent, or Firm*—Steven Capella

(57) ABSTRACT

A data receiver is provided which is operable to receive a signal controllably pre-distorted and transmitted by a transmitter, to generate information for adjusting the pre-distortion applied to the signal transmitted by the transmitter, and to transmit the information to the transmitter. The receiver is further operable to perform adaptive equalization to receive the signal transmitted by the transmitter.

6 Claims, 7 Drawing Sheets

OTHER PUBLICATIONS

Shyh-Jye Jou, et al. "Module Generator of Data Recovery for Serial Link Receiver", National Central University, Taiwan, IEEE, 0-7803-8182-3/2003.

Chih-Kong K. Yang et al. "A 0.8 µm CMOS 2.5 Gb/s Oversampled Receiver for Serial Links," *IEEE International Solid-State Circuits Conference*, 1996.

* cited by examiner

DC Coupling

AC Coupling

HIGH SPEED MULTI-MODE RECEIVER WITH ADAPTIVE RECEIVER EQUALIZATION AND CONTROLLABLE TRANSMITTER PRE-DISTORTION

BACKGROUND OF THE INVENTION

The present invention relates to data receivers, especially for high-speed wired communications.

In high-speed data communications, especially those in which data is transmitted serially at rates greater than one gigabit per second (Gbs), wired communications become unreliable unless an equalizer is used to compensate the channel impairments. Two common types of equalizers are feed forward equalizers ("FFE") and decision feedback equalizers ("DFE"). An FFE is used at a transmitter to pre-process the signal being transmitted in a way that compensates for the distorting effects of the transmission channel. In that way, the pre-processed signal arrives at the receiver with lower distortion. An example of an FFE is a multiple-tap finite impulse response ("FIR") filter. A FIR is a device which digitally processes a serial digital signal for transmission by creating a coefficient-weighted sum of the instant datum of the digital signal together with one or more of the data preceding the instant datum and/or one or more of the data following the instant datum.

A DFE is used at a receiver to counter the effects of distortion present in a signal received from a transmission channel by subtracting scaled values of the preceding data captured by the receiver from the signal arriving at the receiver to capture the instant datum. A DFE is typically implemented as a set of taps through which variable coefficient values are used to scale the preceding data, the output of the taps being applied to a summer to perform the subtraction. An example of a DFE is described in U.S. Pat. No. 5,068,873 to Murakami. Typically, a DFE requires performance of an initial and/or occasional or periodic training sequences in which a transmitter and the receiver linked by a transmission channel are temporarily switched out of normal operation. In such training sequence, the transmitter is caused to transmit a data signal having a known sequence of data values for use at the receiver in characterizing the transmission channel. The results of that characterization are then used to set the tap coefficients of the DFE, typically via an algorithm which converges at high-speed. During normal operation, the DFE tracks variations in the distortion of the channel by monitoring an error signal. The error signal results from comparing the received signal and the reference signal using an algorithm that converges more slowly than that used to initially set the tap coefficients. As such, in normal operation, the DFE adaptively adjusts the tap coefficients in a way which "filters" out some of the variations in channel characteristics.

It is possible for wired communication systems to employ both an FFE at the transmitter and a DFE at the receiver to share the overall task of compensating for distortion in the link. A challenge for high-speed data receivers, especially high-speed serializer-deserializer (SerDes) units, is to simultaneously use both an FFE and a DFE simultaneously, such that the tap coefficients of the equalization devices at both ends of the channel are adjusted for optimal performance. In lower data-rate systems, e.g., systems in which the transmission rate is below 3 Gbs, FFEs having a few taps with preset, (i.e., permanently fixed) tap coefficients provide adequate performance while conserving power and area of the integrated circuit. However, such approach is inadequate for higher transmission rate systems. A serious obstacle exists to using a fixed-coefficient FFE at transmission rates above about 6 Gbs, due to greater variations in transmission characteristics from one channel to another channel, as well as greater variations in channel distortion.

High-speed serial data transmission is conventionally performed according to either a direct current (DC) coupling scheme or an alternating current (AC) coupling scheme, as shown in FIGS. 1 and 2. In a DC coupling scheme, as shown in FIG. 1, the transmitter is conductively connected to the receiver at DC as well as AC via a conductive medium, e.g., through one or more cards, cables, connectors, packages, and backplanes, etc. By contrast, as shown in FIG. 2, in an AC coupling scheme, capacitors 7 are placed in the path of signals between the transmitter and remote receiver to allow only AC signals to pass, while blocking the flow of current at DC between the transmitter and receiver. For this reason, the AC coupling capacitor is also known as a DC blocking capacitor. DC blocking capacitors can be provided on the same integrated circuit, i.e., the "chip" which contains the transmitter or the receiver, on the same package, or in a discrete device provided off the chip. The values of DC blocking capacitors typically range between about 10 nF and about 100 nF.

DC coupling is used only when transmitter and receiver are designed to operate at the same or similar signal common mode level (Vcm). FIG. 1 illustrates a serial data communication system including a transmitter 2, a receiver 3, and a pair of differential signal lines 4 and 5 which carry a data bit signal as a pair of differential signals between the transmitter 2 and the receiver 3. In such communication system, the common mode supply voltage Vtr to the receiver is set to the same level as the common mode supply voltage Vtt to the transmitter to avoid DC current flow between the transmitter and the receiver. The common mode supply voltage Vtt to the transmitter and the receiver operates as a reference level against which the signals arriving at the receiver from differential signal lines are distinguished.

In some DC coupled systems, the transmitter and receiver are designed to perform best when operated together as a matched pair, in which case the transmitter and receiver are said to be "compatible". At minimum, DC coupling requires that the common mode level of the signal arriving at the receiver is within the range in which the receiver is designed to operate.

However, when the common mode level of the arriving signal lies outside the voltage range the receiver is designed to handle, the receiver cannot amplify the signal efficiently, and may recover data poorly. In such a case, and when the common mode level of the arriving signal is not known a priori, an AC coupling scheme is recommended instead of DC coupling. With reference to FIG. 2, in an AC coupled communication system, the receiver independently sets the common mode level of the received signal to a predetermined desirable level. In AC coupled systems, this is accomplished through the use of a supply voltage ("Vtr") at the receiver to supply a DC current for maintaining the common mode signal level, in a manner which is independent from the supply voltage Vtt which is used to maintain the common mode signal level at the transmitter. As also shown in FIG. 2, a termination resistor 8, having a value matching the impedance of the transmission line, e.g., 50 ohm, is placed between a supply voltage Vtr and the data input signals.

Although an AC coupling scheme is advantageous for filtering out low-frequency noise and relaxing common mode demand, it requires that the data signal be transmitted according to a DC balanced code. Stated another way, the data signal arriving at the receiver must have an equal number of bits having the value "1" as the number of bits having the value "0" bits within a designated number of bits, in order to prevent common mode level from shifting. AC coupling also requires the data signal to transition frequently between "1"s and "0"s. In other words, the receiver cannot properly decode a signal in which a long consecutive string of "1s" or "0s" appears at the input to the receiver. Moreover, in systems in which only the data signal is transmitted but not the clock, it is difficult to recover the clock from the transmitted signal when the transmitted signal has long strings of either "1"s or "0"s. An "8b10b" code is an example of a DC balanced code. An 8b10b code guarantees that the data signal transitions at least twice for every 10 bits. However, a data signal transmitted via an 8b10b code requires 10 signal bits to transfer 8 bits of information, equivalent to 20% of bandwidth loss.

It would be desirable to provide serial data communication devices such as the SerDes transmitters and receivers described above, which can be utilized in multiple ways, in communication systems which are DC coupled as well as AC coupled, and in high-speed environments in which channel characteristics cannot be predicted a priori. However, heretofore, such flexibility has not been available in prior SerDes communication systems.

A block diagram illustrating the architecture of a prior art receiver complex 10 which has a targeted data transmission rate of between 2.5 and 3.2 Gbs is shown in FIG. 3. The receiver complex 10 has a front end interface unit FEI 11 at the input end of the receiver 12, which provides termination, ESD protection and circuitry for switching between modes for AC coupling and DC coupling. However, the FEI 11 provides only fixed termination impedances to the differential signal lines Dn and Dp arriving at the receiver 12 (and also to lines Dn' and Dp'), making its design somewhat inflexible. The receiver complex 10 also includes a built-in-self-test (BIST) unit 16, which verifies operation upon initializing the receiver 12 by inputting a known data pattern into the receiver 12 and then verifying the outcome. The BIST unit 16 raises an "ERROR" flag 19 when the receiver 12 does not correctly receive the data.

The receiver 12 includes a pre-amplifier (A), a sample latch (B), and 2:1 demultiplexer (C), also referred to herein as a "demux". The pre-amplifier A amplifies the incoming signals using a peaking device to extend the bandwidth. A pair of latches are provided in the sample latch B. Each takes a one-half rate clock signal (as compared to the recovered clock rate of the incoming data signal) from a clock and data recovery circuit 18 and uses it to sample and latch alternate bits from the signal data stream output by the pre-amplifier. Each of two latches in the demultiplexer C then uses a one-quarter rate clock signal to demultiplex the data and then feed the data into a shift register inside a deserializer 13. Eventually, the deserializer 13 outputs n bits of data in parallel to logic circuitry as Dout.

In the receiver complex 10 shown in FIG. 3, the clock data recovery (CDR) unit 18 extracts the clock from the incoming data stream using a phase rotator and a clock recovery algorithm. The CDR over-samples the differential data signals at the output of the pre-amplifier A and a digital circuit detects the time position of an edge (signal transition) of the differential data signals. The CDR determines a desirable time position at which to sample the differential data signals, as well as generates early and late signals if the detected edge of the data signals is not at its expected position. The early and late signals are used to control the output phase positions of the phase rotator in a feedback loop. However, no early signal and no late signal is generated if no edge is found.

The receiver complex 10 does not include a receiver equalization unit such as a DFE as described above. Despite the lack of a DFE, the receiver complex 10 still provides adequate performance at the above-mentioned 2.5-3.2 Gbs transmission rate. The receiver complex 10 is typically operated in conjunction with a transmitter having an FFE, as described above, in which the tap coefficients are fixed, not allowing the FFE coefficients to be adjusted by feedback over the actual transmission channel between the transmitter and receiver. Thus, in receiver complex 10, no provision has been made for transmitting, by any means, information for updating FFE coefficients of the transmitter from the receiver complex 10 back to the transmitter.

Accordingly, it would be desirable to provide a receiver complex and method for receiving signals in which the aforementioned limitations of the prior art are addressed.

SUMMARY OF THE INVENTION

According to a first aspect of the invention, a data receiver is provided which is operable to receive a signal controllably pre-distorted and transmitted by a transmitter, to generate information for adjusting the pre-distortion applied to the signal transmitted by the transmitter, and to transmit the information to the transmitter. The receiver is further operable to perform adaptive equalization to receive the signal transmitted by the transmitter.

According to a preferred aspect of the invention, a data receiver is provided which includes an automatic gain control unit including a variable gain amplifier and a peaking amplifier. In a first mode, the variable gain amplifier is operable to amplify a data-carrying signal from a transmitter to a predetermined level and the peaking amplifier is operable to amplify the signal substantially without peaking. In a second mode, the variable gain amplifier is operable to amplify the signal with fixed gain and the peaking amplifier is operable to amplify the signal with peaking.

In this preferred aspect of the invention, the data receiver further includes a decision feedback equalizer ("DFE"), operable to determine values of transmitted data bits from the signal amplified by the automatic gain control unit. The DFE is operable in the first mode to perform equalization, and operable in the second mode to perform without equalization. In addition, an equalization processor is provided which is operable to generate first information for adaptively adjusting the equalization performed by the DFE in the first mode, and operable to generate second information for adjusting the pre-distortion applied to the data-carrying signal by the transmitter.

According to this preferred aspect of the invention, the data receiver further includes an up-channel transmitter operable to transmit the second information to the transmitter on a transmission channel to which the data receiver is connected for receiving the data-carrying signal from the transmitter.

According to another aspect of the invention, a method is provided for receiving data from a data-carrying signal transmitted by a transmitter. Such method includes receiving values of data bits from the data-carrying signal with equalization at the receiver. At the receiver, first information is generated for adjusting an amount of the equalization performed, and second information is generated for adjusting an amount of pre-distortion applied to the data-carrying signal by the transmitter. The second information is transmitted to the transmitter, for use in the transmitter adjusting the amount of pre-distortion.

DETAILED DESCRIPTION

Accordingly, in the embodiments of the invention described herein, a robust wire communication system is provided in which tap coefficients of a DFE in the receiver at one end of a transmission channel is updated during normal data transmission operation. In addition, tap coefficients of an FFE at the transmitter at another end of the transmission channel are updated by feedback from the receiver. Such feedback is provided through the transmission channel itself, such as during a test mode. A receiver complex according to an embodiment of the invention includes a central equalization unit operable to generate equalization information for updating the tap coefficients of the DFE at the receiver complex and those of the FFE of the remote transmitter. In a further embodiment described herein, the receiver complex includes an up-channel communication device which transmits the coefficient updating information generated at the receiver complex to the FFE located at the transmitter.

Figure 1:
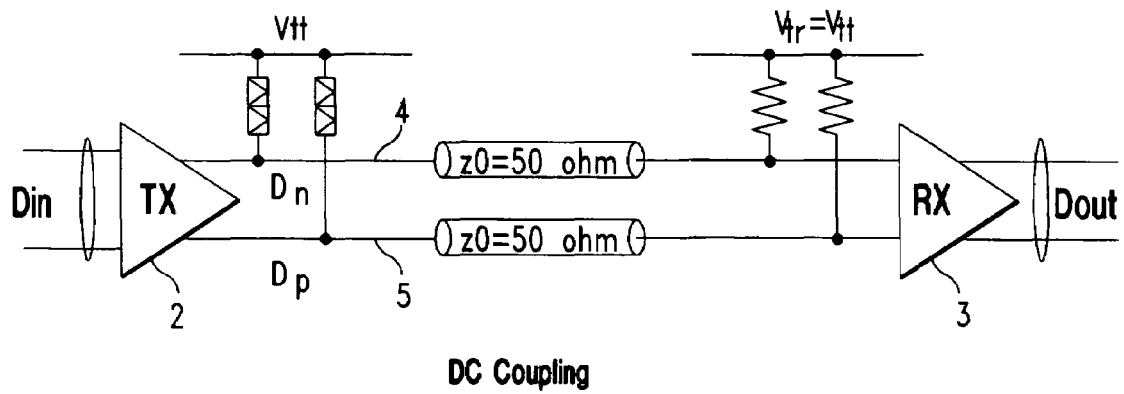
FIG. 1 is a diagram illustrating a communication system in which transmitter and a receiver are connected via DC coupling.
Figure 2:
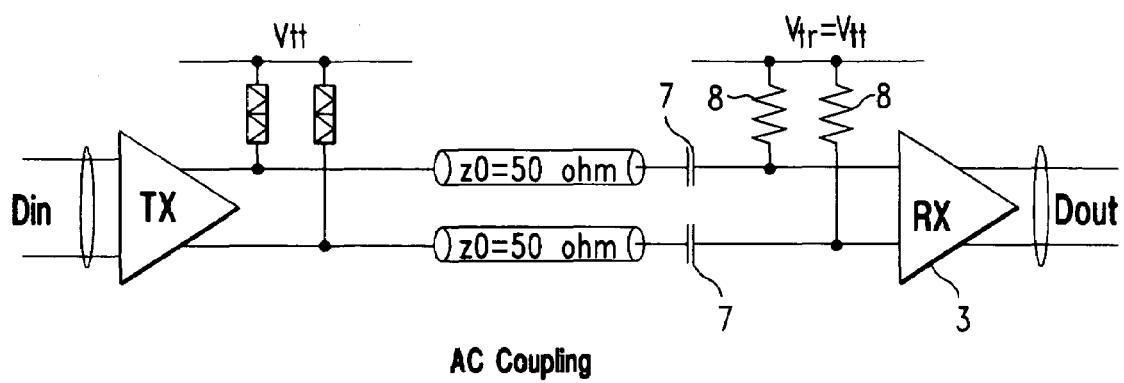
FIG. 2 is a diagram illustrating a communication system in which a transmitter and a receiver are connected via AC coupling.
Figure 3:
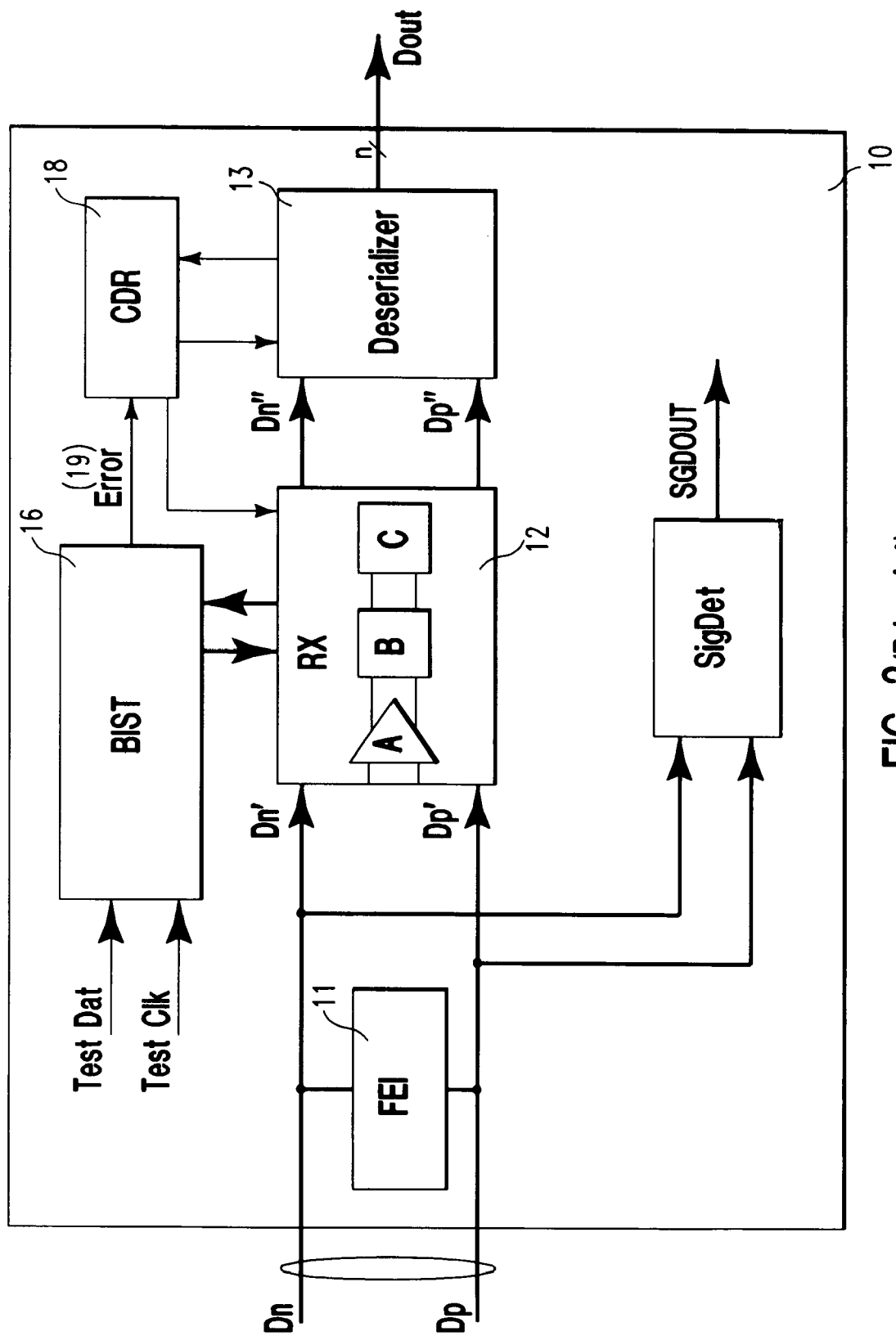
FIG. 3 is a diagram of a receiver complex which is background to the present invention.
Figure 4:
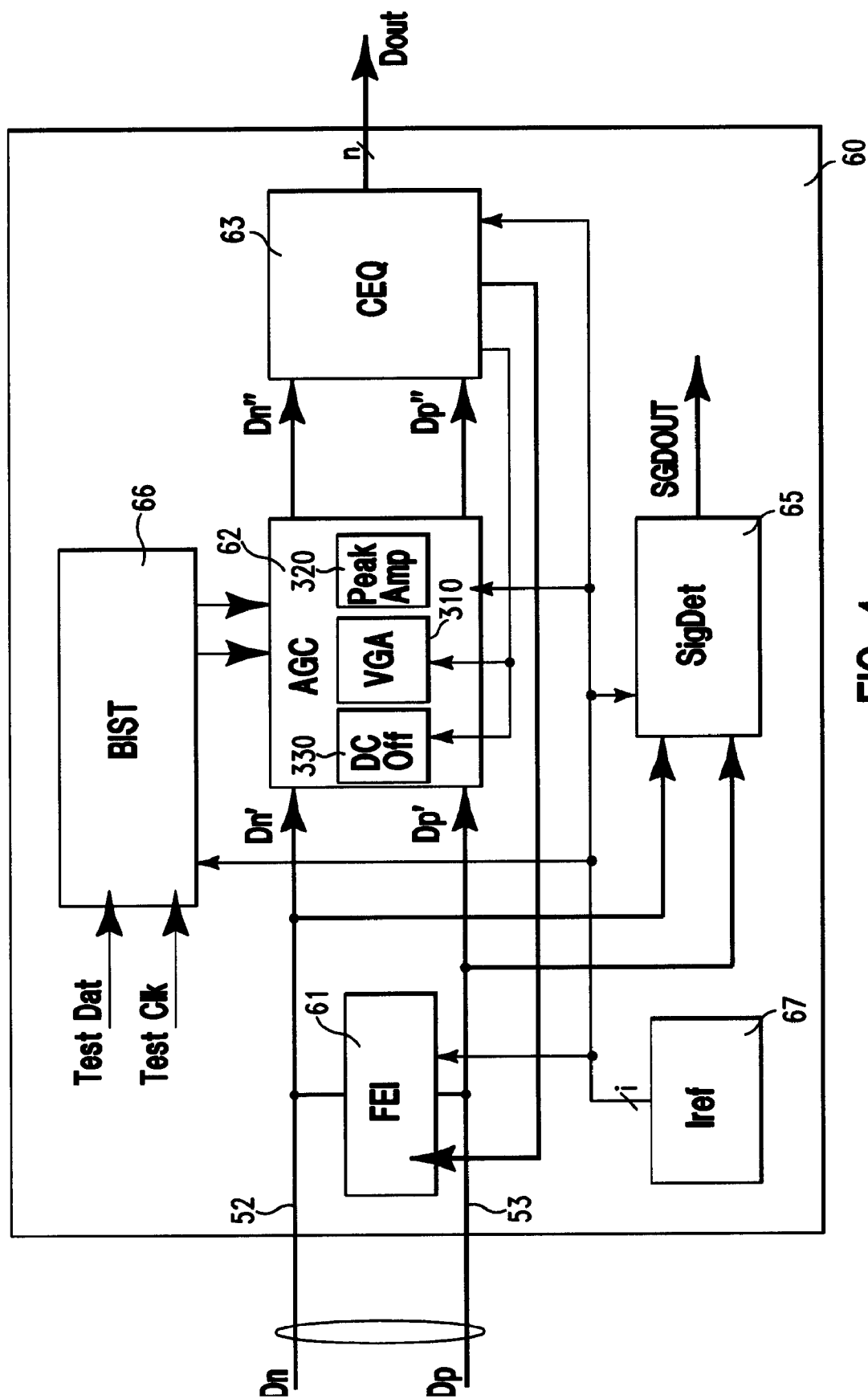
FIG. 4 is a diagram of a receiver complex according to an embodiment of the present invention.

A receiver complex 60 for a high-speed, high-performance SerDes core according to an embodiment of the invention is illustrated in FIG. 4. The receiver complex 60 may be implemented on an integrated circuit, i.e., a chip, partly on a chip and on a component with which the chip is packaged, or partly on a chip and on an element of a larger assembly such as a component of a circuit board or a component mounted to a circuit board. As shown in FIG. 4, the receiver complex 60 includes a front-end interface (FEI) unit 61 having AC and DC operational modes which allows the receiver complex 60 to operate in either an AC coupled system or a DC coupled system, respectively. The front-end interface (FEI) unit 61 also performs testing and provides coarse and fine adjustable control over the value of the impedance used to terminate the differential signal lines 52 and 53 on which the data signals Dn and Dp arrive at the receiver complex 60. Circuitry for programmably adjusting the value of terminating impedances is described in commonly assigned U.S. patent application Ser. No. 10/250,177 filed Jun. 10, 2003, the entirety of which is hereby incorporated herein by reference. The FEI 61 further includes circuitry for protecting the receiver complex 60 against electro-static discharge (ESD). In addition, the FEI 61 includes circuitry for transmitting signals on the differential signal lines 52, 53 in an up-channel direction from the receiver complex 60 back to a remote transmitter at the other end of the signal lines 52, 53. A particular embodiment of a circuit permitting communication of information from a SerDes receiver complex in an up-channel direction back to a transmitter is described in commonly assigned U.S. patent application Ser. No. 10/319,705 filed Dec. 13, 2002, the entirety of which is hereby incorporated herein by reference. In addition, a system for generating information at a receiver for updating coefficients of an FFE and for transmitting that information back to the transmitter is described in commonly assigned U.S. patent application Ser. No. 10/710,064 filed Jun. 16, 2004, the entirety of which is hereby incorporated herein by reference.

Figure 8:
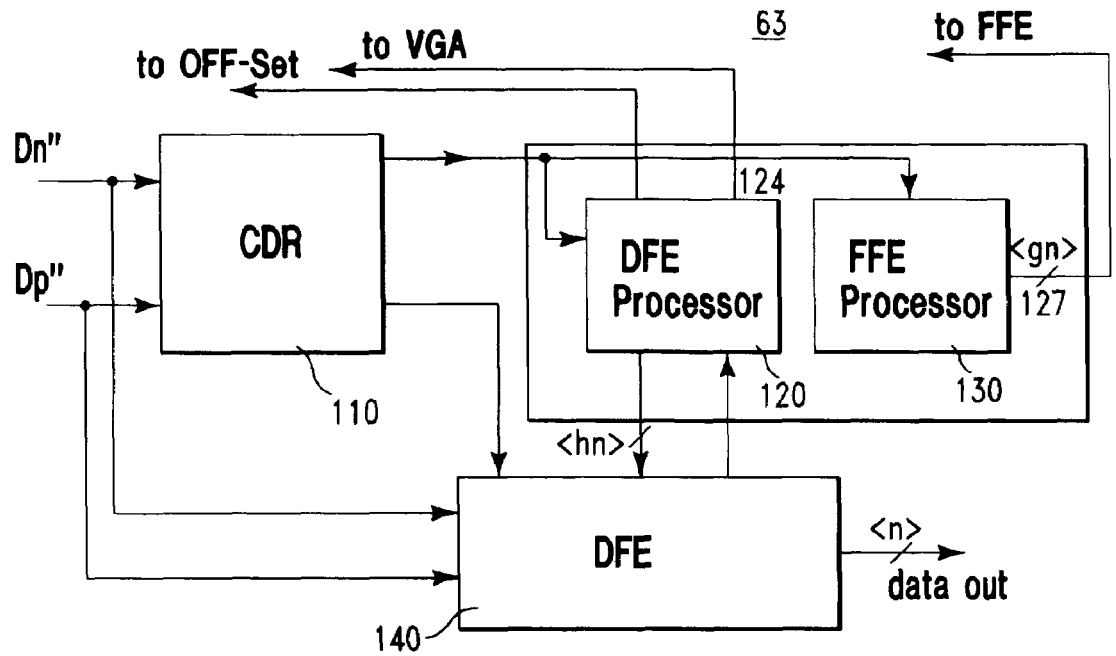
FIG. 8 is a diagram illustrating a central equalization unit of the receiver complex according to an embodiment of the invention.

As further shown in FIG. 4, an automatic gain control (AGC) unit 62 allows signal gain to be controlled in a way that allows the performance of a decision feedback equalizer (DFE) included in a central equalization unit (CEQ) 63 at the receiver to optimized. The AGC 62 is also operable to provides DC offset cancellation. Referring also to FIG. 8, the CEQ unit 63 includes a clock data recovery unit (CDR) 110, the DFE 140, a DFE processor 120 for generating information for setting and updating the tap coefficients of the DFE 140, and an FFE processor 130 for generating information for updating the tap coefficients of the FFE of the transmitter from which the differential data signals Dn" and Dp" are ultimately received. The FFE coefficients are generated and transmitted to the FFE of the transmitter via the up-channel transmission circuit of the FEI 61, as discussed in the foregoing.

The CDR 110, shown in FIG. 8, is used to generate a sampling clock in phase synchronization to the amplified differential data signals Dn" and Dp" input thereto from the AGC unit 62 (FIG. 4). The CDR 110 is also operable to control adaptive compensation to reduce or eliminate DC offset between the differential data signals Dn" and Dp". In one embodiment, the CDR 110 determines a difference in the eye width of the received signals Dn" and Dp" between the even data bits of the signals and the odd data bits of the signals and controls the amount and direction of the DC offset compensation provided to the signals until the difference in the eye width is brought within an acceptable tolerance. In such embodiment, or in another embodiment, a difference is determined in the eye height of the received differential signals between "1" and "0" data bits, and the amount and direction of the DC offset compensation is controlled in accordance therewith.

Referring again to FIG. 4, a signal detecting (SigDet) unit 65 is operable to detect the presence or absence of the differential signals (Dn' and Dp') arriving from the transmission channel, as conditioned by the FEI 61. The purpose of the SigDet is to quickly determine the validity or invalidity of the incoming data on lines 52, 53 in case of sudden interruption of the transmission link between transmitter and the receiver complex 60. The SigDet 65 is also operable to detect several types of cable fault conditions. The output (SGDOUT) of the SigDet 65 is provided to a logic block (not shown) for the purpose of making a decision whether the incoming signals Dn' and Dp' are valid and capable of being sampled by the CDR to produce the sampling clock. Illustratively, a system for detecting the presence or absence of a signal at an input to a high-speed serial data receiver is described in commonly assigned U.S. patent application Ser. No. 10/604,799 filed Aug. 18, 2003, the entirety of which is hereby incorporated herein by reference. The afore-mentioned elements of the receiver complex 60 permit much improved data transfer, especially at serial data transmission rates above about 2.5

Gbs, whether the receiver complex 60 is operated in AC coupled mode or DC coupled mode.

A further element of the receiver complex 60 is a built-in self test (BIST) unit 66 which is operable to test operational features throughout the receiver complex 60. The BIST unit 66 provides complete testability to the receiver complex 60 unit while it is operated in a test mode. During the test mode, test data and a test clock are sent to the BIST 66 which creates test patterns to test the AGC unit 62, which outputs to the CEQ unit 63, thus testing the CEQ unit 63 as well. In one embodiment, the BIST unit 66 is implemented on a per-link basis to test the hardware of the receiver complex at the wafer level and at the module level. In one embodiment, the BIST unit 66 is operable in a test mode in conjunction with a wrap/test multiplexer of AGC unit 62 described below to perform testing of the receiver complex such as a full-duplex wrap back test, involving also an adjacent serial data transmitter connected to a remote receiver. In addition, a reference generator (Iref) 67 of receiver complex 60 is operable to generate reference currents for supply to each of the afore-mentioned elements.

Figure 5:
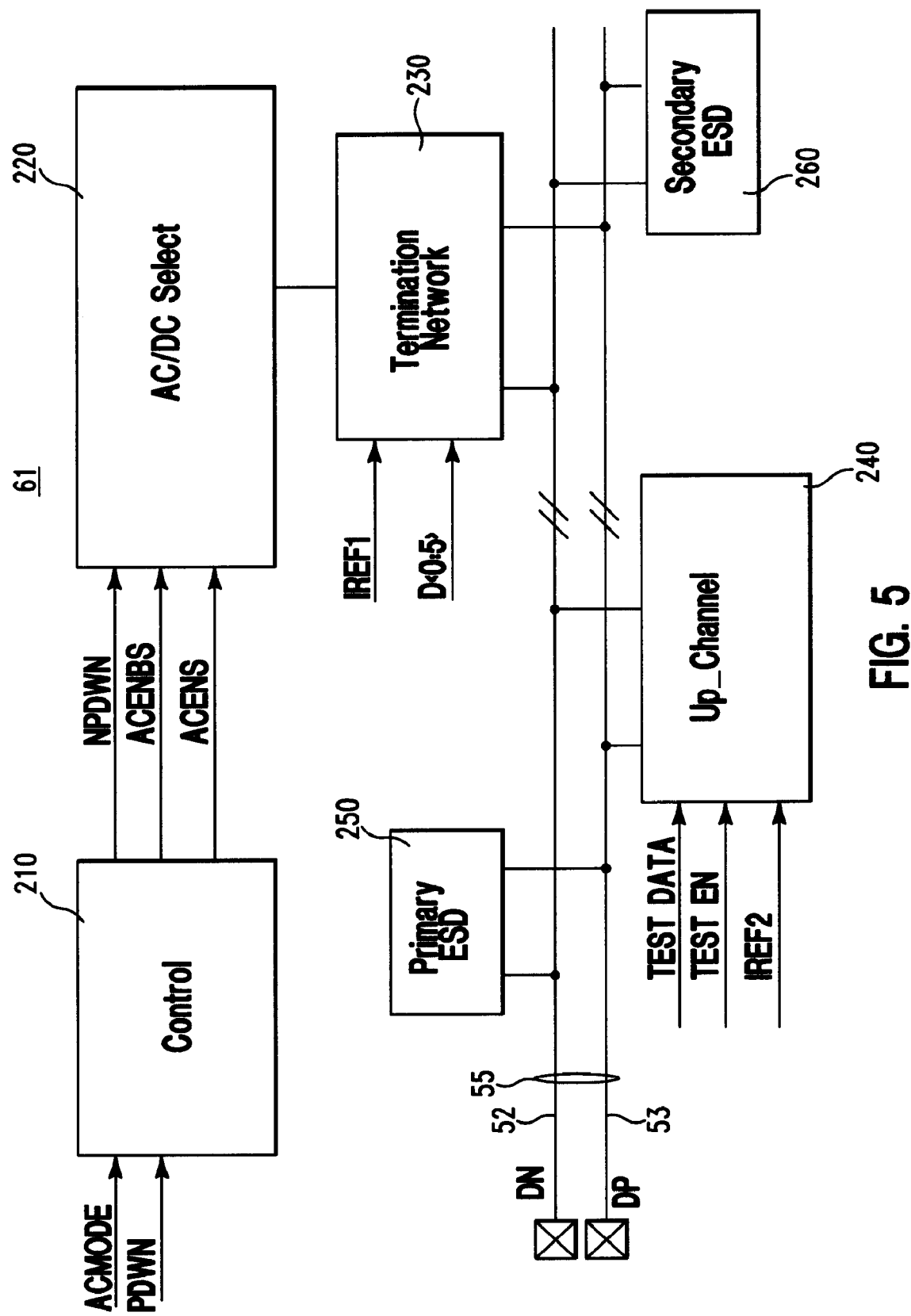
FIG. 5 is a diagram illustrating a front-end-interface (FEI) unit of the receiver complex according to an embodiment of the invention.

A more detailed description of the component elements and operation of each of the elements of the receiver complex 60 will now be provided. With reference to FIG. 5, the front end interface unit 61 includes six functionally defined units: a control unit 210, an AC/DC select unit 220, an adjustable termination network unit 230, an up-channel communication unit 240, a primary electrostatic discharge (ESD) Unit 250 and a secondary ESD unit 260.

Control over the selection of AC coupling mode versus DC coupling mode is performed as follows. Control signals ACMODE and PDWN, e.g., from logic circuitry, are input to the control unit 210, which in turn provides the AC and DC mode selection signals ACENS and ACENBS and power down control signal NPWDN to the AC/DC select unit 220. The AC/DC select unit 220 controls a variable amount of current provided to the termination network 230 in accordance with whether AC or DC mode operation is selected, as well as programmably controlling the amount of impedance used to terminate the differential signal lines 52, 53. The termination network 230 includes a regulator (not shown) used to regulate the common mode level of the differential signal lines 52, 53 through programmable termination network 230. In this example, six binary bits, referenced at D<0:5>, are provided for selecting impedance elements to adjust the values of terminating resistors, and reactive (capacitive and/or inductive) impedance elements. Such on-chip programmably adjustable impedance matching helps to reliably provide a matched terminating impedance, despite variations, including frequency-dependent variations, which might not be expected in the impedance present at the receiver, e.g., due to the interface to external circuits and the package interface.

The up-channel communication unit 240 is used to test the operability of the cable 55 including the differential signal lines 52, 53 during a test mode. The up-channel communication unit 240 transmits equalization information on the differential signal lines 52, 53 back to a remote transmitter that ordinarily transmits the differential data signals Dn and Dp, that equalization information being used to set and update the tap coefficients of the FFE that resides in the remote transmitter. In one embodiment, when the up-channel communication unit 240 is active, the equalization information may include only adjustment values for altering the current values of the tap coefficients. In another embodiment, the equalization information may include either such adjustment values or the tap coefficients themselves. In still another embodiment, the up-channel communication unit 240 transmits encoded information for updating the tap coefficients of the FFE at the remote transmitter.

The primary ESD unit 250 and the secondary ESD unit 260 are used to protect devices whose gates are directly connected to the pads from being damaged by unexpected high surges in voltage and current. Techniques for protecting integrated circuits, i.e., "chips" from large, undesirable current and voltage are well known. Damage caused by electro-static discharge (ESD) has become a major reliability concern. As the gates of MOSFET devices are getting thinner and thinner, to prevent such gates from being damaged by high voltages, both a primary ESD unit 250 and a secondary ESD unit 260 function cooperatively to protect the MOSFET devices on the chip. The primary ESD unit 250 is placed near the external bond pad of the chip, while the secondary ESD unit is placed closer to the circuitry in question in the application. From industrial specifications, the pads having primary ESD protection devices must be able to withstand dielectric voltages of over 2000 V. One way that such ESD protection devices operate is by dissipating electrostatic charges to ground or to a power supply by avalanche breakdown of diodes that are reverse-biased with respect to the pad and ground or reverse-biased with respect to the pad and the power supply. The protection structure includes a p-n type diode connected between the pad and the power supply, or a p-n type diode connected between the pad and the substrate of the chip. According to a rule of thumb for pads whose input voltage does not exceed a diode voltage above the power supply (e.g. 1.8 V), a double-diode network is used. In one embodiment, the primary and secondary ESD protection units are identical in structure but have different sizes according to the particular requirements at their somewhat different locations.

In order for the DFE-based receiver of the present embodiment of the invention to function most effectively, it needs a receiver system that operates linearly, i.e., that provides linear amplification. Nonlinear signal amplification by the receiver degrades the ability of the DFE to compensate distortion. To maintain linearity, an automatic gain control unit 62 is provided, as shown in FIG. 4. The AGC unit 62 is operable adjust the level of the differential signals Dn' and Dp' arriving thereto from the FEI 61 to avoid compression and/or nonlinear distortion.

Figure 6:
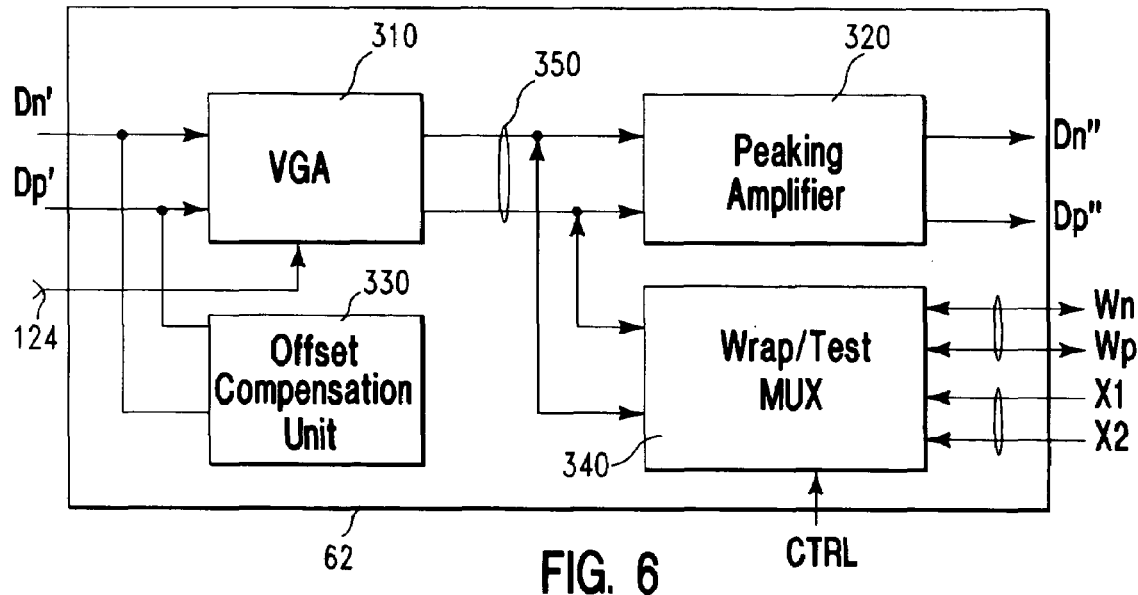
FIG. 6 is a diagram illustrating an automatic gain control (AGC) unit of the receiver complex according to an embodiment of the invention.

A detailed diagram of the automatic gain control (AGC) unit is provided in FIG. 6. As shown therein, the AGC unit 62 includes a variable gain amplifier (VGA) 310, a peaking amplifier 320, a DC offset compensation circuit 330 and a wrap/test multiplexer 340. In one embodiment, the peaking amplifier can be such as that described in commonly assigned U.S. patent application Ser. No. 10/250,043 filed May 30, 2003. Such peaking amplifier compensates for rolloff in the frequency response at higher frequencies. This application is hereby incorporated by reference herein.

When the receiver complex is operated in a DFE mode, the VGA 310 and the peaking amplifier 320 are operated together as a cascaded amplifier unit to amplify the incoming signal with variable gain. In such DFE mode, data is received with decision feedback equalization performed by the DFE 140 (FIG. 8). In DFE mode, the VGA 310 operates with variable, automatically controllable gain, and the peaking amplifier 320 operates with fixed gain. The peaking amplifier 320 can be operated in a number of ways. In one embodiment, in DFE mode, the peaking amplifier 320 operates with constant peaking, at which time the amplitude at the peaking and the particular peaking frequency are fixed. In such embodiment, the peaking amplifier can also operate with a variable magnitude of peaking and according to a variable peaking frequency. It is preferable to employ variable peaking characteristics when the receiver complex is operated in a non-DFE mode, as described below.

In DFE mode, the gain of the VGA is adjusted automatically in relation to the Dn' and Dp' signal level through feedback signal 124 from the DFE 140 (FIG. 8). As a result, the input signal is automatically amplified to a predetermined output level. The feedback signal 124 from the DFE includes a set of gain control vectors provided to the VGA 310 to control the gain of the cascaded amplifier unit including the VGA and the peaking amplifier 320.

In addition to the receiver operating with decision feedback equalization using a DFE, as described above, the receiver complex can also operate in a "non-DFE mode" in which the signal is sampled and latched without using decision feedback equalization. The receiver can operate in non-DFE mode whether the transmitter operates with an FFE or, instead operates without an FFE. In non-DFE mode, the VGA 310 is set to its maximum gain level and operates as a fixed gain amplifier, while the peaking amplifier 320 is used to optimize the signal at the output. In one embodiment, when the receiver is operated in non-DFE mode, the peaking amplifier is operated with variable peaking instead of fixed peaking. In such case, the peaking amplifier has a 'peak' control vector used to adjust the variable amount of peaking applied to the signal at the amplitude signal transition. In such embodiment, a 'pole' control vector is used to set the frequency at which the maximum peaking is applied. Through use of the peaking amplifier 320 in non-DFE mode, the 'eye' opening of the amplified differential signals Dn" and Dp" output by the AGC unit 62 is maximized.

The offset compensation unit 330 includes a digital-to-analog converter (DAC) which is controlled through an 'offset' vector. The offset compensation unit 330 is used to correct any DC offset voltage present on the differential signals Dn' and Dp' input to the VGA 310, regardless of whether such DC offset originates in the signal path from the remote transmitter to the VGA 310 or is introduced by the VGA 310 and the peaking amplifier 320. In one embodiment, the offset compensation circuit 330 operates by adding an input-referred offset voltage to the differential signals Dn' and Dp', the added voltage having the same magnitude but the opposite sign as the original DC offset, with the objective of returning the DC offset of the differential signals Dn" and Dp" at the output to zero.

This is best explained with reference to FIG. 7A, which illustrates examples of three conditions. In condition 1) of FIG. 7A, the differential signals Dn' and Dp' are DC balanced, i.e., both signals have the same DC component, such that no offset compensation is needed. This results in the eye height of the signals at the receiver being the same for both a "1" bit in the data stream (eye height A+), and a "0" bit in the data stream (eye height A−). However, condition 2) of FIG. 7A shows a different situation in which the Dn' signal has a positive DC offset with respect to the Dp' signal. In such case, the eye height A+' of the signal is greater on "1" bits than the eye height A−' of the signal on "0" bits. Such condition 2) can be measured and corrected as described below. In another condition 3) shown in FIG. 7A, the Dp' signal has a positive DC offset with respect to the Dn' signal. In such case, the eye height A+" of the signal is lower on "1" bits than the eye height A−" of the signal on "0" bits. This condition 3) is also corrected, as described below.

Figure 7:
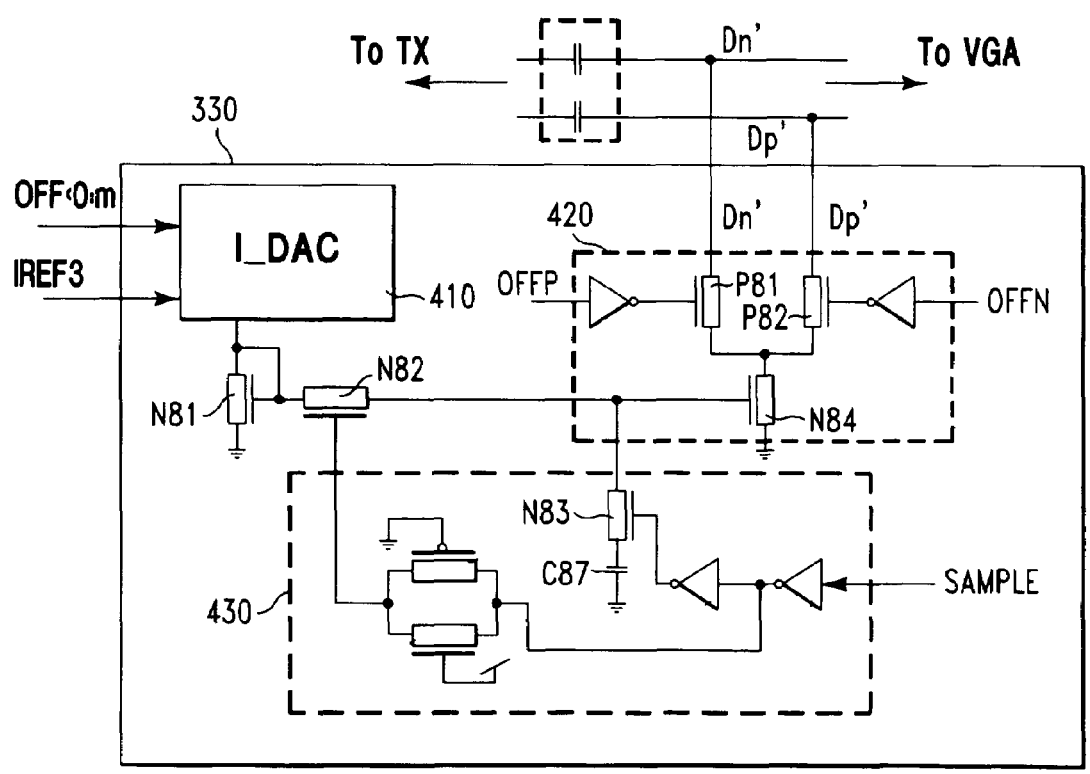
FIG. 7 is a diagram illustrating an offset compensation unit of the receiver complex according to an embodiment of the invention.
Figure 7A:
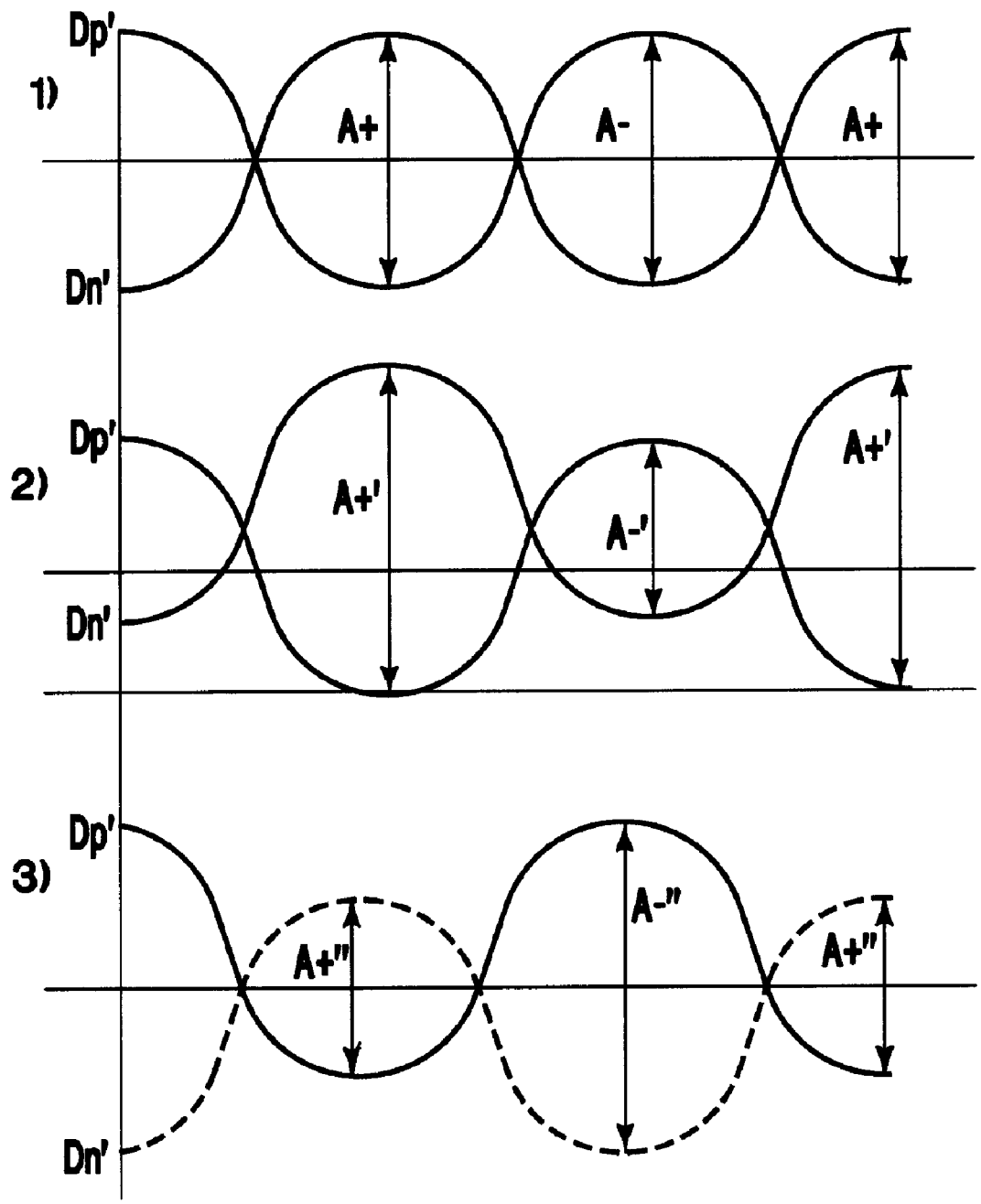
FIG. 7A is a diagram illustrating DC balanced differential signals and signals having DC offsets.

An example of a DC offset compensation unit 330 is shown in FIG. 7. As illustrated therein, a digital-to-analog converter controlled current generator (I_DAC) 410 is operable to provide a high-resolution of offset compensation of the differential signals Dn' and Dp' at the input to the VGA 310. Illustratively, the smallest incremental offset compensation is between about 30 mV, such that the DC offset can be compensated in increments of 30 mV. The amount of offset compensation applied to one or the other of the differential signals Dn' and Dp' is determined by an eye-center computation circuit in the DFE (FIG. 8) through a set of binary vectors "OFF<0:m>" outputted therefrom to the I_DAC 410, these binary vectors and a reference current "IREF3" from the reference current generator 67 (FIG. 4) being used to generate the offset compensation voltage as determined by the DFE.

The offset compensation voltage is applied to one of the differential signals Dn' and Dp' through a circuit 420. That circuit includes a pair of source-coupled n-type field effect (NFET) transistors P81 and P82 and an n-type field effect transistor (NFET) N84 used as a tail device, i.e., a biasing transistor. The biasing transistor N84 has a gate coupled to receive a high-resolution biasing input from I_DAC 410 through NFETs N81 and N82, which determines the magnitude of the offset compensation provided to each individual one of the differential signals Dn' and Dp'. The polarity of the offset compensation is determined by two complementary control bits, "OFFP" and "OFFN", that are generated by the DFE (FIG. 8). Only one such control bit, OFFP or OFFN is active at a time, such that OFFP is active when the offset compensation is to be applied to pull down the Dp' signal, and OFFN is active when the offset compensation is to be applied to pull down the Dn' signal.

The offset compensation circuit 330 further includes an offset value holding circuit 430 used for holding the current value of the offset compensation voltage when a new vector of OFF<0:m> is presented to the I_DAC 410. This circuit is provided to avoid transitional states from being propagated to the differential signals Dn' and Dp' when the offset compensation voltage is being reset to a new value through a new vector of OFF<0:m>. In operation, since offset compensation is operated continuously, when the new vector of OFF<0:m> is presented to the IDAC, a control signal "SAMPLE" is asserted at the input to circuit 430 which holds the previous offset compensation voltage. The control signal "SAMPLE" is applied to NFET N83 that connects to a capacitor C87. An inverted version of "SAMPLE" is applied to the gate of another NFET N82. When the I_DAC 410 is changing from one value of output current to another, NFET N82 is off and NFET N83 is on, which maintains the bias to NFET N84 at the last previously set value. After allowing sufficient time for the I_DAC 410 to settle, the new bias level is applied to tail device (NFET N84) by switching off the "SAMPLE" control signal. In such manner, transitional glitches during the transitioning of the I_DAC 410 from one bias level to another are avoided from being propagated to the differential data signals.

Control over the polarity of the offset compensation voltage is effected at circuit 420 as follows. When the signal "OFFP" is asserted, i.e., by a high voltage at OFFP and a low voltage at OFFN, NFET P81 turns off, and NFET P82 turns on, such that the bias is applied only to the cable that carries the Dp' signal. Otherwise, when the signal "OFFN" is asserted, i.e., by a high voltage at OFFN and a low voltage at OFFP, the bias is applied only to the cable that carries the Dn' signal.

In one embodiment, circuit 420, being coupled to the differential signal lines Dn' and Dp', is also operable as the transmitter 240 (FIG. 5) use to conduct up-channel communications from the receiver complex back to the transmitter, such as for transmitting equalization information, as described above relative to FIG. 5.

Referring again to FIG. 6, a wrap/test multiplexer circuit 340 is provided which operates on the signal path at the intermediate node 350 between the VGA 310 and the peaking amplifier 320, for performing wrap and test functions. In one embodiment, in a wrap mode, the VGA 310 is disabled, and the wrap/test multiplexer 340 conducts internally wrapped differential data signals Wn and Wp into node 350 to drive the output of the peaking amplifier 320. In a wrap mode according to a particular embodiment, the peaking amplifier is disabled, and the differential data signals output from the VGA at node 350 are conducted through the wrap/test multiplexer 340 to provide an external wrap function. For example, the data output by a neighboring transmitter on the same SerDes core as the receiver is conducted through the wrap/test multiplexer 340 to the peaking amplifier 320.

The test function of the multiplexer 340 is similar to the above-described wrap modes except that instead of internally wrapping or re-directing the differential data path signals, logic level signals X1 and X2 that swing between levels VDD and GND are supplied to the intermediate node 350 to facilitate testing of the AGC unit 62.

As discussed above, the receiver complex is capable of operating in several modes. One operational mode is non-DFE mode, in which the received input signals are processed through the VGA, then captured in the sampling logic and then deserialized for output without any equalization applied at the receiver. A second operational mode is DFE mode, in which prior data bit samples of the received data signal stream are summed together according to a set of adjustable tap coefficients to compensate for distortion caused by transmission media between the remote transmitter and the receiver. In DFE mode, prior data bit samples are also used to generate information for adaptively updating the tap coefficients according to changing characteristics of the distortion caused by the transmission media. In the one communication mode, the FFE equalization performed at the remote transmitter, if any, is open loop, i.e., not adaptively adjusted in response to equalization processing performed at the receiver. For example, DFE mode is used when the remote transmitter has fixed FFE coefficients. In a third operational mode, both the DFE of the receiver complex operates, as well as an FFE at the remote transmitter.

The central equalization unit (CEQ) 63 (FIG. 8) is the element of the receiver complex that permits operation in all three of these modes. Referring to FIG. 8, the CEQ 63 includes a DFE 140, a DFE processor 120 coupled to receive the output of the DFE for generating information for updating the tap coefficients of the DFE, as well as an FFE processor 130 for generating information for updating the tap coefficients of the FFE of the remote transmitter. Such equalization information is generated during actual transmission of the differential data signals Dn and Dp between the remote transmitter and the receiver, and is fed back to the DFE and the FFE for updating the respective tap coefficients in real time.

Another component element of CEQ 63 is the clock data recovery (CDR) circuit 110 described hereinafter. The CDR detects the position of edges (transitions) of the differential data signals. The CDR also generates "early" and "late" signals indicative of whether the phase of the clock used to sample the data appears early or appears late. The CDR employs a phase rotator and digital data sampling logic which are operated in a feedback loop to maintain the phase of the sampling clock in synchronization with the differential data signals. The early and late signals are provided through digital logic to the phase rotator to control the output phase position of the rotator in the feedback loop. The "early" signal indicates that the detected edge position within the incoming data stream is earlier than the expected position. The early signal forces the rotator to move in the "up" direction, thus advancing the phase of the sampling clock. On the other hand, the late signal forces the rotator to move in the "down" direction, which delays the phase of the sampling clock. In such manner, the CDR operates in a feedback loop to remain locked on the edge position by over-sampling the data stream and continuously adjusting the phase of the sampling clock by way of the phase rotator.

Figure 9:
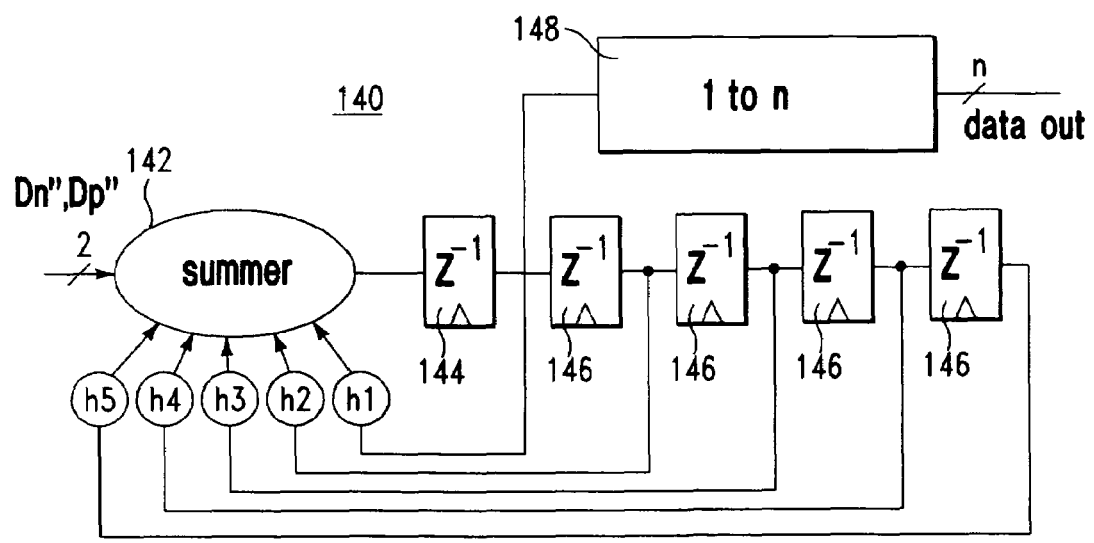
FIG. 9 is a diagram illustrating a decision feedback equalizer (DFE) of a receiver complex according to an embodiment of the invention.

An exemplary construction of a DFE 140 used in the receiver complex is shown in FIG. 9. In the DFE, the differential data signals Dn" and Dp" output from the AGC unit 62 are input to a summer 142 in the DFE, together with sampled data bits obtained from the differential signals for each of the last five previous sampled data bits and weighted by the coefficients h1, h2, h3, h4, and h5 (where "hn" represents tap coefficients of the nth previous bit). The output of the summer 142 is sampled by an edge triggered latch 144 at the full clock rate. The output of this latch is the h1 signal which is fed back to the summer. The output of latch 144 is deserialized into n (e.g., n=4, 8, 16, 20) number of data outputs in the 1-to-n deserializer block 148. Additional half rate edge triggered latches 146 are used to generate delayed versions of the signals for multiplication by the coefficients h2, h3, h4, and h5, as shown in FIG. 9. The overall performance obtained by the equalization of the DFE depends on the optimized total bandwidth, linearity, and stabilization of the "h" parameters in the complete data path from the differential data input pads, through the AGC, and finally to the summer 142.

Returning again to FIG. 8, the DFE processor 120 and the FFE processor 130 are desirably implemented as state machines in the CEQ 63. In a particular embodiment, the DFE processor 120 may use least-mean squares (LMS) adaptation scheme. It is known that the least-mean squares (LMS) adaptation can be realized using only a fixed amplitude sign signal as an error signal between the received signal and a desired reference signal to update tap coefficients. Efficient determination of an appropriate sign error and provision of a suitable reference signal to drive the adaptation with low hardware complexity is required to enable the sign-error driven LMS algorithm to function optimally. In this equalization architecture, a single level comparator and a programmable DC level are used to perform several different functions including: 1) derive an appropriate sign error required for LMS DFE tap coefficient updates, 2) derive an associated sign error capable of driving a DC-offset compensation loop and 3) derive control information for the AGC amplifier to use in maintaining a desired 54 received signal level at a received threshold comparator. More than one algorithm can be used for each of the DFE processor and the FFE processor for balancing speed of convergence and the complexity of computation.

Referring again to FIG. 4, and as described above, a signal detector (SigDet) 65 is used to detect when valid signals are received, and when one can depend on the validity of such signals to perform clock recovery. However, when the system is expected to receive valid signals, but due to interference such as noise spikes, cross-talk, hardware failure, etc., can cause the received signals to become invalid or unreliable. In such manner, when the SigDet 65 detects loss of the data signal on lines 52, 53, the system in which the receiver complex 60 is integrated may demand that data arriving at the receiver be resent to avoid loss of information. SigDet can also detect several types of line faults, such as cable stuck-at fault, open signal line, shorted signal line, etc. This is crucial for a receiver system to detect situation when cable faults occur during data transfer. Therefore, such line fault detecting capability would enable the system to examine the quality of a signal line. It is also desirable to catch the faults and replace the faulty line as early as possible.

With further reference to FIG. 4, a centralized reference generator (IREF) 67 is used to generate all the current and voltage references required by each unit of the receiver system. The details for implementing the IREF 67 circuit can be as described in commonly assigned U.S. patent application Ser. No. 10/249,545 filed Apr. 17, 2003, the entirety of which is hereby incorporated herein by reference. These reference currents and voltages are used to bias the tail devices of all the analog circuit blocks. They also are used for regulating voltage and other analog applications. The centralized reference generator 67 is unique in this design as compared to a conventional local reference generator. It not only produces a bias reference levels which are robust, but also saves power and area. In the IREF 67, a band-gap reference (BGR) generator (not shown) is used to create a constant voltage level that is independent of supply voltage and the temperature of the chip on which it is implemented. Through the BGR, a plurality of various values of resistance dependent and resistance independent current references are created and transferred to each of the circuit blocks. This approach is known to produce references which are less sensitive to the process and environmental variation.

Thus, as described in the foregoing, a robust multi-mode receiver is provided which is capable of operating in each of a NRZ mode, a DFE mode and a DFE/FFE mode, and which includes further enhancements which allow the receiver complex to operate with a desirably low bit error rate at data transmission rates which are in higher frequency range than those at which data receivers have operated in the past.

While the invention has been described in accordance with certain preferred embodiments thereof, those skilled in the art will understand the many modifications and enhancements which can be made thereto without departing from the true scope and spirit of the invention, which is limited only by the claims appended below.

What is claimed is:

1. A method of receiving data from a data-carrying signal transmitted by a transmitter, comprising:
    using an automatic gain controlled amplifier at the receiver to amplify the data-carrying signal to a predetermined level, the automatic gain controlled amplifier including a variable gain amplifier and a peaking amplifier, such that in a first mode, the variable gain amplifier amplifies the data-carrying signal to a predetermined level and the peaking amplifier amplifies substantially without peaking, and in a second mode, the variable gain amplifier amplifies with fixed gain and the peaking amplifier amplifies with peaking;
    receiving values of data bits from the data-carrying signal with equalization at the receiver;
    generating first information for adjusting an amount of the equalization performed at the receiver;
    generating second information for adjusting an amount of pre-distortion applied to the data-carrying signal by the transmitter; and
    transmitting the second information to the transmitter.

2. The method as claimed in claim 1, wherein the second information includes information for adjusting a characteristic of a feed forward equalizer (FFE) of the transmitter.

3. The method as claimed in claim 2, wherein the information for adjusting a characteristic of the FFE includes information for adjusting tap coefficients of the FFE.

4. The method as claimed in claim 1, further comprising compensating a direct current (DC) voltage offset of the data-carrying signal at the data receiver.

5. The method as claimed in claim 4, further comprising controlling an amount of the DC voltage offset compensation as a result of the equalization performed at the receiver.

6. The method as claimed in claim 1, further comprising adjusting the gain of the variable gain amplifier automatically as a result of receiving the data with equalization.

* * * * *